(12) United States Patent
Ruthemann (10) Patent No.: US 7,933,156 B2
(45) Date of Patent: Apr. 26, 2011

(54) ADJUSTING A DIGITAL DELAY FUNCTION OF A DATA MEMORY UNIT

(75) Inventor: Klaus W. Ruthemann, Backnang (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 136 days.

(21) Appl. No.: 12/293,118

(22) PCT Filed: Mar. 17, 2006

(86) PCT No.: PCT/EP2006/060849
§ 371 (c)(1),
(2), (4) Date: Jan. 14, 2009

(87) PCT Pub. No.: WO2007/107182
PCT Pub. Date: Sep. 27, 2007

(65) Prior Publication Data
US 2009/0219771 A1  Sep. 3, 2009

(51) Int. Cl.
*G11C 7/10* (2006.01)
(52) U.S. Cl. .......... 365/189.05; 365/189.12; 365/233.1; 365/233.11
(58) Field of Classification Search ............. 365/189.05, 365/189.12, 233.1, 233.11
See application file for complete search history.

(56) References Cited

U.S. PATENT DOCUMENTS

| | | | |
|---|---|---|---|
| 6,125,157 A | | 9/2000 | Donnelly et al. |
| 7,519,746 B2 * | | 4/2009 | Shiraishi ................. 710/52 |
| 2003/0012320 A1 | | 1/2003 | Bell |

* cited by examiner

*Primary Examiner* — Amir Zarabian
*Assistant Examiner* — Kretelia Graham
(74) *Attorney, Agent, or Firm* — Coats & Bennett, P.L.L.C.

(57) ABSTRACT

An apparatus for adjustment of a digital delay function of a data memory unit comprising said data memory unit (102), an elastic store register, ESR, (104) and read clock and write clock adapted to control read and write operations, a write counter associated with the write clock and a read counter associated with the read clock. Said memory (102) works in series with said ESR (104). The memory (102) delivers two data elements from two logically neighbouring cells. Said ESR (104) writes the two data elements from the memory (102) at every cycle of the write clock, wherein if the write counter is increased by one at a cycle of the write clock the output position in the memory (102) is not changed, and if the write counter is increased by two at one cycle of the write clock the output position in the memory (102) is moved backward by one data element and if the write counter is not changed at one cycle of the write clock the output position in the memory (102) is moved forward by one data element.

20 Claims, 7 Drawing Sheets

ADJUSTING A DIGITAL DELAY FUNCTION OF A DATA MEMORY UNIT

FIELD OF THE INVENTION

The present invention relates to an apparatus and a method for adjustment of a digital delay function of a data memory.

BACKGROUND OF THE INVENTION

The problem the invention solves concerns the adjustment of a delay function for digital data transmission. This delay function usually is realized with the help of a serial shift register or an addressable RAM, or alternatively using a standalone elastic store register, combined with a PLL and a VCO.

In solutions known in the art, which use serial shift registers the input or output of a serial shift register was adjusted when changing the delay, i.e. it virtually was moved with the help of a multiplexer. A disadvantage of this solution is that one data element either is repeated or respectively is left out (depending on whether the delay has to be increased or decreased).

In prior art solutions, which use an addressable RAM the adjustment of a delay function was implemented by changing the dynamic addressing of the write or read pointers, i.e. the address difference is either increased or decreased. Disadvantage of this solution is exactly the same as in solutions using serial shift registers described above.

In solutions using a standalone elastic store register combined with a PLL and a VCO it is possible to make a phase offset in order to get an adjustment of delay function. Disadvantage of this solution is that it is difficult to make the elastic store register big enough, because the PLL's phase detector constant (Volts/radiants) decreases and it may be difficult to vary the phase by adding a DC voltage to the control circuit (in case of an analogue PLL) or adding an offset (in case of a digital PLL, i.e. when the PLL's behaviour is realized by numeric operations instead of discrete components).

Hence, an improved apparatus and method for adjustment of a digital delay function of a data memory would be advantageous and in particular one that allows to adjust the digital delay function without distorting the data information.

SUMMARY OF THE INVENTION

Accordingly, the invention seeks to preferably mitigate, alleviate or eliminate one or more of the disadvantages mentioned above singly or in any combination.

According to a first aspect of the present invention there is provided an apparatus for adjusting a digital delay function of a data memory unit. In this embodiment, the apparatus comprises a data memory unit having a plurality of memory cells to store corresponding data elements, an elastic store register, a read clock function and a write clock function configured to control read and write operations, and a read counter associated with the read clock function, and a write counter associated with the write clock function. The data memory unit is configured to operate in series with the elastic store register such that data elements passing through the apparatus are arranged in a parallel structure in the memory cells, and pass through the data memory unit before passing through the elastic storage register, selectively change an output position from a first memory cell to a second memory cell, and deliver two subsequent data elements to the elastic store register from two logically neighboring memory cells. The elastic store register is configured to write the two subsequent data elements output from the data memory unit at every cycle of the write clock. If the write counter is increased by one at a cycle of the write clock, the output position in the data memory unit is unchanged. If the write counter is increased by two at a cycle of the write clock, the output position in the data memory unit is moved backward by one data element. If the write counter is unchanged at a cycle of the write clock, the output position in the data memory unit is moved forward by one data element.

According to a second aspect of the present invention there is provided an apparatus for adjusting a digital delay function of a data memory unit. In this embodiment, the apparatus comprises a data memory unit having a plurality of memory cells to store corresponding data elements, an elastic store register, a read clock function and a write clock function configured to control read and write operations, and a read counter associated with said read clock and a write counter associated with said write clock. The data memory unit is configured to operate in series with the elastic store register such that data elements passing through the apparatus are arranged in a parallel structure in the memory cells, and pass through the elastic store register before passing through the data memory unit. The elastic store register is configured to read, at every cycle of the read clock, two subsequent data elements to be input into the data memory unit. Additionally, the data memory unit is further configured to selectively change an input position from a first memory cell to a second memory cell, and write the two subsequent data elements into two logically neighboring memory cells. If the read counter is increased by one at a cycle of the read clock, the input position in the data memory unit is unchanged. If the read counter is increased by two at one cycle of the read clock, the input position in the data memory unit is moved backward by one data element. If the read counter is not changed at one cycle of the read clock, the input position in the data memory unit is moved forward by one data element.

According to a third aspect of the present invention there is provided a method for adjusting a digital delay function of a data memory unit. In one embodiment, the method comprises arranging data elements in a parallel structure of corresponding memory cells in the data memory unit. The data elements pass through the data memory unit before they pass through the elastic store register. The method then outputs two subsequent data elements from two logically neighboring memory cells of the data memory unit to the elastic store register. The two subsequent data elements are written at every cycle of a write clock function in the elastic store register. Particularly, if the write counter is increased by one at a cycle of the write clock, the output position in the data memory unit is unchanged. If the write counter is increased by two at one cycle of the write clock, the output position in the data memory unit is moved backward by one data element. If the write counter is not changed at one cycle of the write clock, the output position in the data memory unit is moved forward by one data element.

According to a fourth aspect of the present invention there is provided a method for adjusting a digital delay function of a data memory unit. In this embodiment, the method comprises arranging data elements in a parallel structure of corresponding memory cells in the data memory unit. The data elements pass through the data memory unit before they pass through the elastic store register. The two subsequent data elements are then read at every cycle of a read clock function in the elastic store register, and input into two logically neighboring memory cells of the data memory unit. If the read counter is increased by one at a cycle of the read clock, the output position in the data memory unit is unchanged. If the read counter is increased by two at one cycle of the read clock, the output position in the data memory unit is moved backward by one data element. If the read counter is not changed at one cycle of the read clock, the output position in the data memory unit is moved forward by one data element.

Further features of the present inventions are as claimed in the dependent claims.

The present invention beneficially allows for step by step adjusting a digital delay memory with no bit errors or bit slips. An additional advantage is that the invention can be implemented in any data processing equipment where it is necessary to adjust delay without distorting the data information.

BRIEF DESCRIPTION OF THE DRAWINGS

The present invention will be understood and appreciated more fully from the following detailed description taken in conjunction with the drawings in which.

DESCRIPTION OF AN EMBODIMENT OF THE INVENTION

Figure 1A:
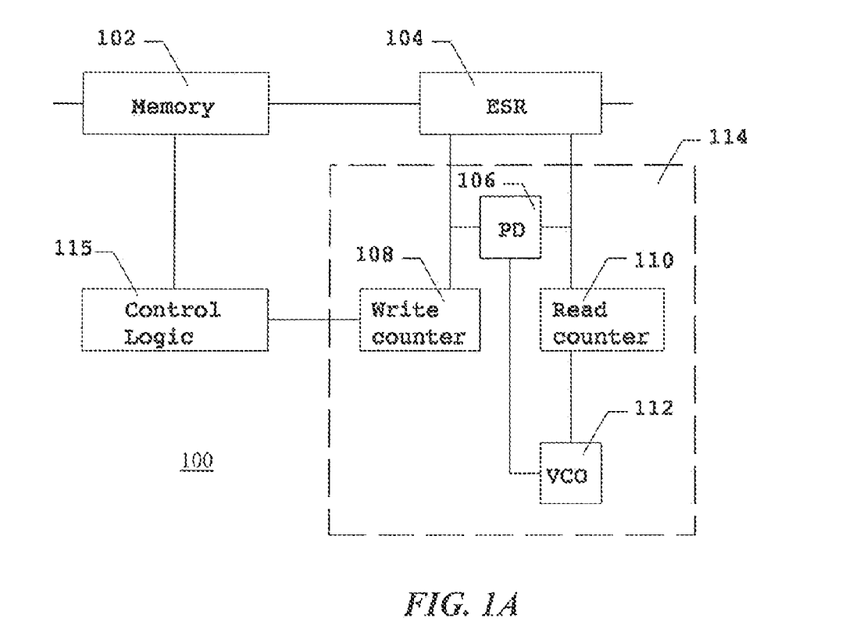
FIG. 1A is a diagram illustrating an apparatus for adjustment of a digital delay function of a data memory unit in accordance with one embodiment of the present invention.
Figure 2:
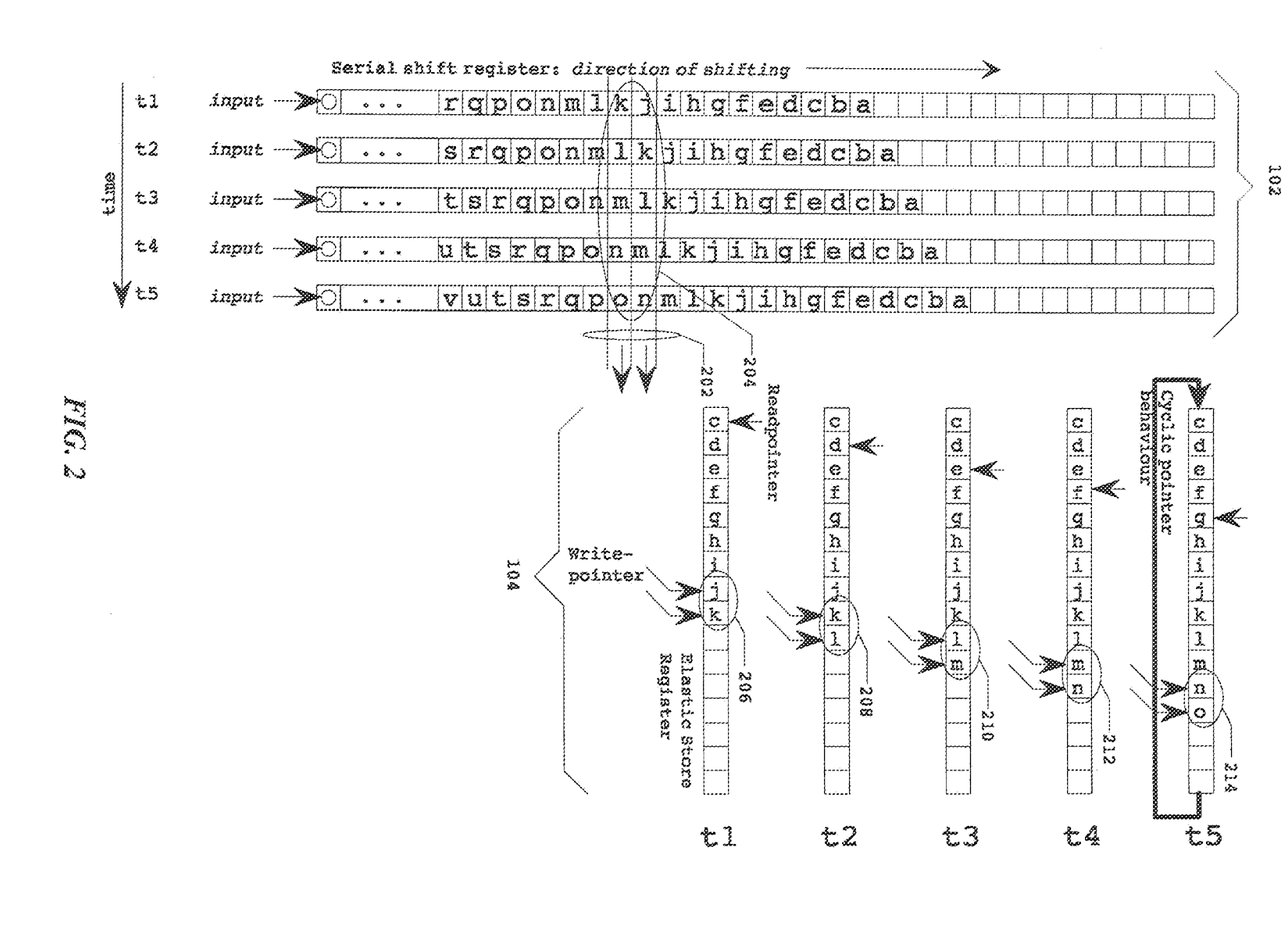
FIG. 2 is a diagram illustrating operation of the apparatus for adjustment of a digital delay function in normal operation in accordance with one embodiment of the present invention.

With reference to FIG. 1A and FIG. 2 an apparatus 100 for adjusting a digital delay function of a data memory unit 102 and its operation is presented. For the sake of clarity the drawings present the invention in a very schematic way with elements not essential for understanding the invention omitted.

In one embodiment the apparatus 100 comprises said data memory unit 102 and an elastic store register (ESR) 104. Said data memory unit 102 works in series with said elastic store register 104 and data elements passing through the apparatus 100 are arranged in a parallel structure, and they pass through the data memory unit 102 before they pass through the elastic store register 104.

The main function of an ESR, 104, is to work as a data bridge between two separated nets, each using its own clock. The clock frequencies, however, have to be equal, but their phases are allowed to differ at a rate of, for example 16 Bit. Therefore the capacity of the ESR, 104, must be at least 16 Bit (or even more).

The heart of an ESR, 104, is a parallel addressable n-bit latch. The incoming data are written to subsequent latches with the help of a demultiplexer (not shown). This demultiplexer directly is driven by the write-pointer. The write-pointer is a cyclic binary counter (4 bit wide if used with a 16 bit ESR). It should be noted that the terms "pointer" and "counter" mean the same when used with an ESR like the one illustrated in the present description: "pointer" is the function and "counter" is the hardware realisation of that function. This is applicable to both write and read "pointers" and "counters".

At the output of the ESR, 104, this n-bit-latch is read with the help of a multiplexer. The multiplexer is driven by the read-pointer. The read-pointer also is a cyclic binary counter (4 bit wide if used with a 16 bit ESR).

The write-pointer and the read-pointer both are compared with respect to their specific addresses with the help of a phase detector 106. The detector's, 106, output is connected to the control input of the Voltage Controlled Oscillator (VCO) 112. This results in a closed loop, affecting the read-pointer to follow the write-pointer with an 8-bit delay on an average (as illustrated in FIG. 2 through FIG. 7 the distance between the write-pointer and the read-pointer is 7-8 bit).

As it was explained earlier an ESR contains latches, each having a specific address of 0 up to 15, if a 16 bit ESR is used. The associated write and read counters are allowed to overflow, that means the count sequence would wrap around from 15 to 0, such as . . . , 8, 9, 10, 11, 12, 13, 14, 15, 0, 1, 2, 3 . . . , which is illustrated in FIG. 2 through FIG. 7 as cyclic pointer behaviour.

Whenever the write clock (input) is affected with jitter, the ESR's output jitter is decreased dependent on the properties of the complete loop.

The apparatus further comprises a read clock function and a write clock function that control read and write operations. A read counter 110, which is also part of the apparatus 100, is associated with said read clock and a write counter 108 is associated with said write clock.

The data memory output, 202, delivers two subsequent data elements from two logically neighbouring memory cells, 204, and said elastic store register 104 writes the two subsequent data elements, output from the data memory unit 102, at every cycle of the write clock. Said data memory unit 102 has an adjustable access for outputting data 202, which means that the position of the output 202 can be changed (i.e. shifted backward and forward).

If the write counter 108 is increased by one at a cycle of the write clock the output position in the data memory unit 102 is not changed. This situation is illustrated in FIG. 2 where data elements "k" and "j" at time t1 are output from data memory output 202 and subsequently written in the ESR 104 at time t1 in position 206. The same operation is repeated at every cycle of the write clock and data elements 204 from the output 202 of the data memory 102 are read and then written in the ESR 104 at positions 208 through 214 and the delay of the data elements in the ESR 104 in the time-span t1-t5 is not affected.

Figure 3:
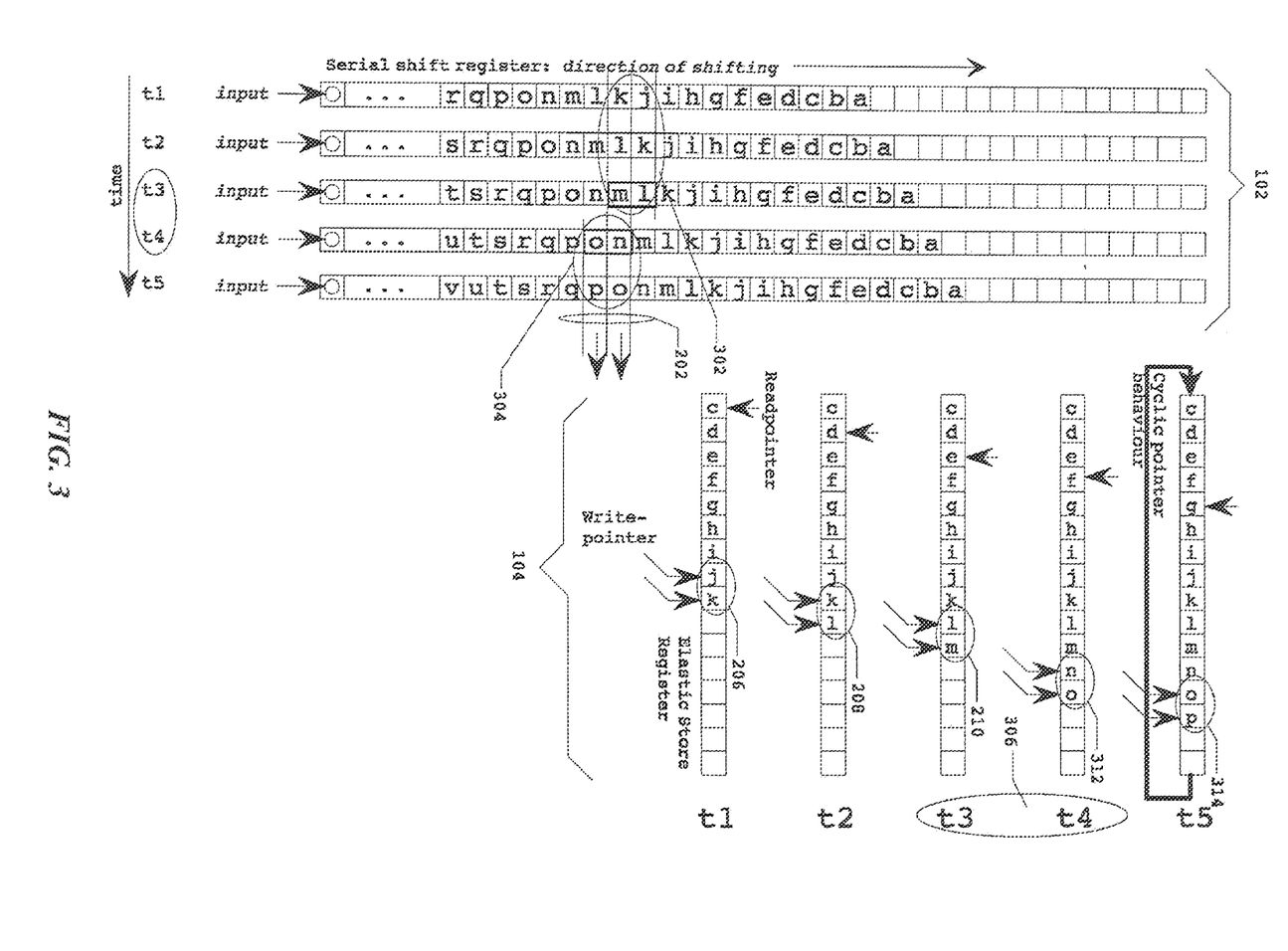
FIG. 3 is a diagram illustrating operation of the apparatus for adjustment of a digital delay function when the delay is reduced in accordance with one embodiment of the present invention.

If the write counter 108 is increased by two at one cycle of the write clock the output position in the data memory unit 102 is reduced by one data element and in consequence the delay is readjusted to its old value. This is illustrated in FIG. 3 and initially data elements 302 at times t1-t3 are output from data memory output 202 and subsequently written in the ESR 104 respectively at times t1-t3 in positions 206-210 with the delay not affected. When the write counter 108 is increased by two the output position 202 is reduced (i.e. shifted backward) in cycle t4 by one data element. In cycles t4 and t5 data elements 304 are output from data memory 102 and subsequently written in the ESR 104 respectively at times t4-t5 in positions 312-314 and as illustrated in FIG. 3, 306, the number of data elements in cycle t4 is increased by two instead of increase by one as in cycles t1-t3. As the difference of the write pointer 108 and the read pointer 110 of the ESR 104 is increased at time position t4, the PLL 114 then will force the pointers to rearrange at 180 degrees in phase. Finally, as a result of this operation, the overall delay is reduced by one element.

Figure 4:
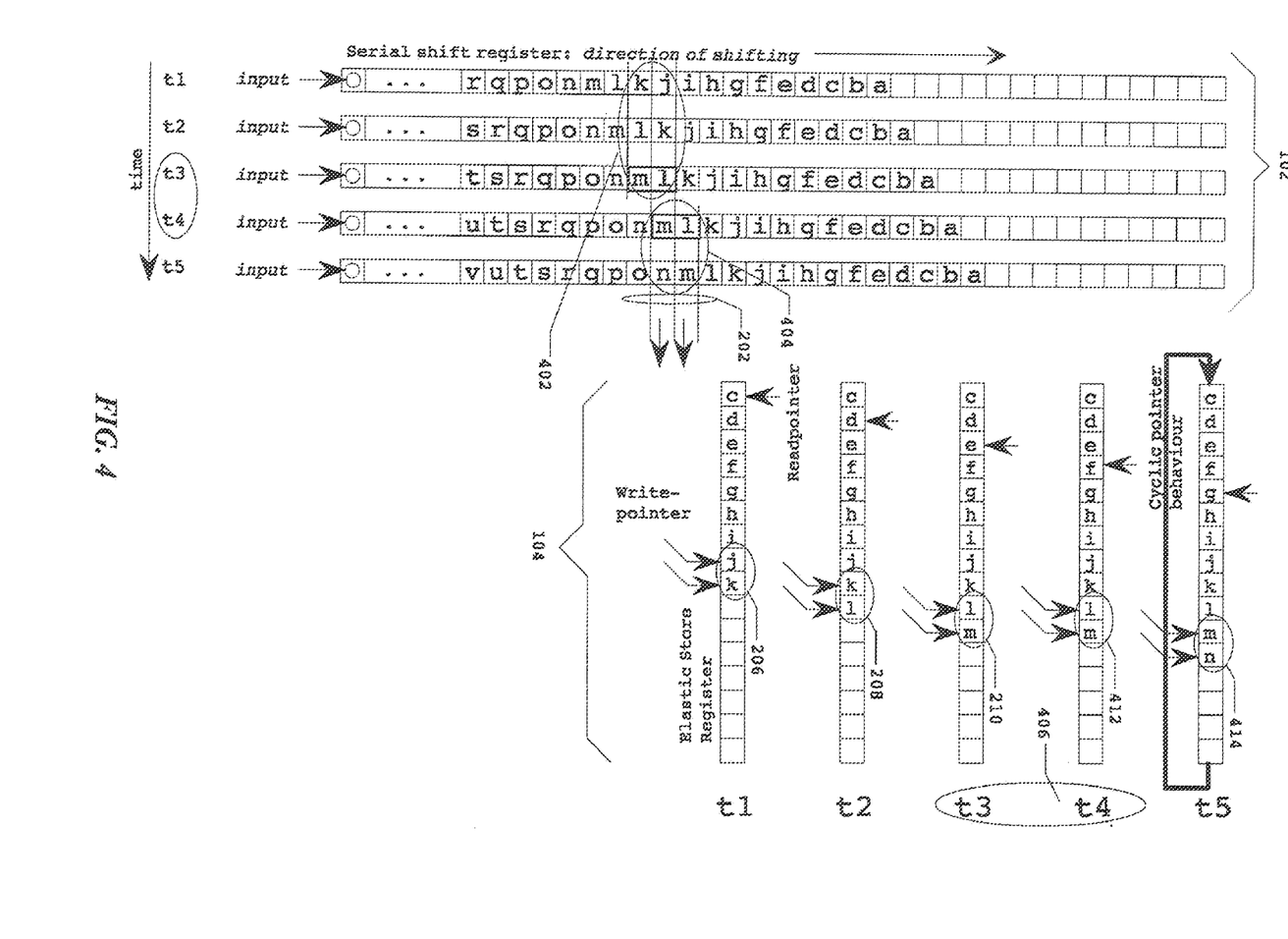
FIG. 4 is a diagram illustrating operation of the apparatus for adjustment of a digital delay function when the delay is increased in accordance with one embodiment of the present invention.

If the write counter 108 is not changed at one cycle of the write clock the output position in the data memory unit 102 is increased by one data element and in consequence the delay is readjusted to its old value. This is illustrated in FIG. 4 and initially data elements 402 at times t1-t3 are output from data memory output 202 and subsequently written in the ESR 104 respectively at times t1-t3 in positions 206-210 with the delay not affected. When the write counter 108 is not changed the output position 202 is increased (i.e. shifted forward) in cycle t4 by one data element. In cycles t4 and t5 data elements 404 are output from data memory 102 and subsequently written in the ESR 104 respectively at times t4-t5 in positions 412-414. As illustrated in FIG. 4, 406, the number of data elements in cycle t4 is not changed in comparison to the number of data elements in cycle t3, while in cycles t1-t3 the number of data elements increase by one in every one of the cycles t1-t3. As the difference of the write pointer 108 and the read pointer 110 of the ESR 104 is reduced at time position t4, the PLL 114 then will force the pointers to rearrange at 180 degrees in phase. Finally, as a result of this operation, the overall delay is increased by one element.

In one embodiment, as illustrated in FIG. 1A, the read clock function is controlled by a Phase Detector 106 and a Voltage Controlled Oscillator 112. In general, "read" is referred to an "output" whereas "write" is referred to an "input" and considering any apparatus for data transmission, a succeeding circuit usually doesn't have any possibilities to control the clock of the preceding blocks. Therefore only the read clock is controlled. In one embodiment the Voltage Controlled Oscillator 112 is part of the apparatus 100 and in alternative embodiment the VCO signals are taken from an external device (i.e. the VCO is not part of the apparatus 100).

In one embodiment the elastic store register 104 is controlled by a Phase Locked Loop (PLL), 114. A phase-locked loop is a closed-loop feedback control system that maintains a generated signal in a fixed phase relationship to an incoming signal. In the embodiment illustrated in FIG. 1A the PLL, 114, consists of a Phase Detector 106, that provides the phase difference to control, a reference signal (not illustrated) that provides a value to compare (i.e. usually 8 when the ESR is 16 elements large), a VCO 112, as well as write and read counters 108 and 110 respectively.

Design and operation of PLL is well known in the art and therefore it is within contemplation of the present invention that the PLL, 114, used in the described above embodiment may be replaced by other types of phase-locked loop circuits without necessity of extensive research or experimentation.

In one embodiment of the present invention the data memory unit 102 has an internal structure of a RAM structure type and in alternative embodiment said data memory unit 102 has an internal structure of a Serial Shift Register.

Figure 1B:
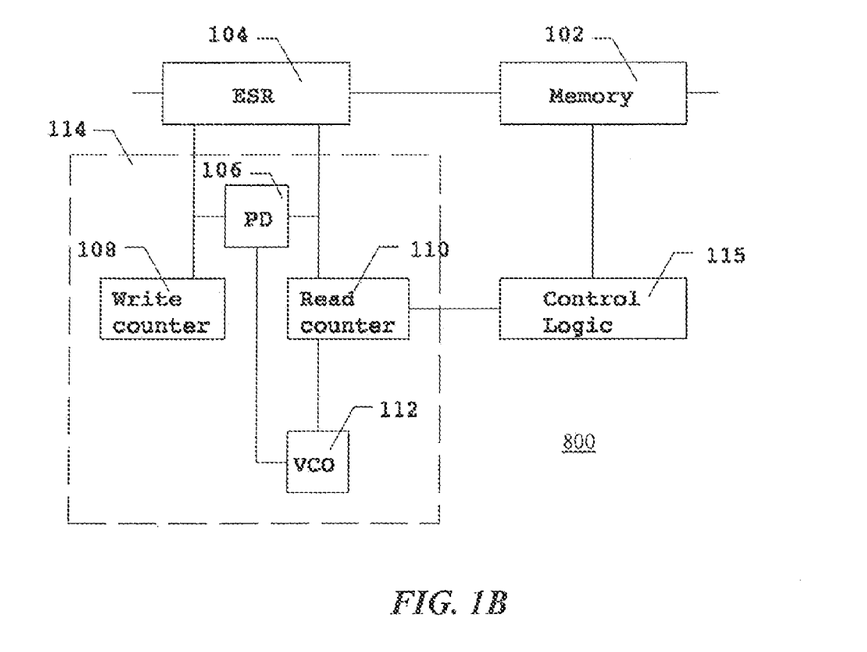
FIG. 1B is a diagram illustrating an apparatus for adjustment of a digital delay function of a data memory unit in accordance with one embodiment of the present invention.
Figure 5:
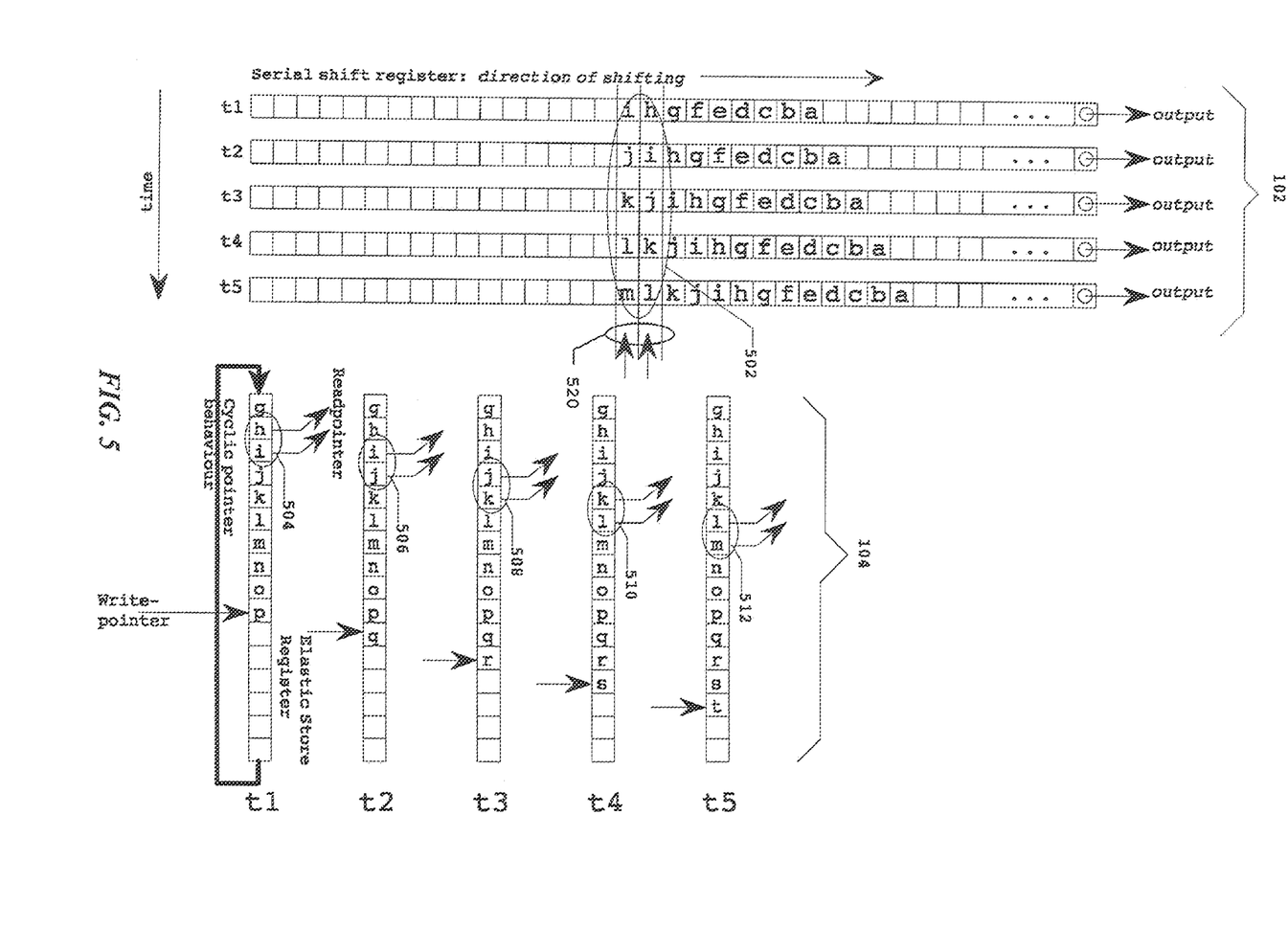
FIG. 5 is a diagram illustrating operation of the apparatus for adjustment of a digital delay function in normal operation in accordance with one embodiment of the present invention.

With reference to FIG. 1B and FIG. 5 an apparatus 800 for adjusting a digital delay function of a data memory unit 102 and its operation is presented. In one embodiment the apparatus 800 comprises said data memory unit 102 and an elastic store register (ESR) 104. Said data memory unit 102 works in series with said elastic store register 104 and data elements passing through the apparatus 100 are arranged in a parallel structure, and they pass through the elastic store register 104 before they pass through the data memory unit 102.

The apparatus 800 further comprises a read clock function and a write clock function that control read and write operations. A read counter 110, which is also part of the apparatus 100, is associated with said read clock and a write counter 108 is associated with said write clock.

Said elastic store register 104 reads, at every cycle of the read clock, two subsequent data elements to be input into the data memory unit 102 and said data memory 102 writes said two subsequent data elements into two logically neighbouring memory cells. Said data memory unit 102 has an adjustable access for inputting data 520, which means that the position of the input 520 can be changed (i.e. shifted backward and forward).

If the read counter 110 is increased by one at a cycle of the read clock the input position 520 in the data memory unit 102 is not changed. This situation is illustrated in FIG. 5 where data elements "h" and "i" at time t1 are output from the ESR 104 and subsequently written in the data memory 102 at time t1 in position 502. The same operation is repeated at every cycle of the read clock and data elements 506-512 from the ESR 104 are read and then written in the data memory 102 at positions 502 and the delay of the data elements in the data memory 102 in the time-span t1-t5 is not affected.

Figure 6:
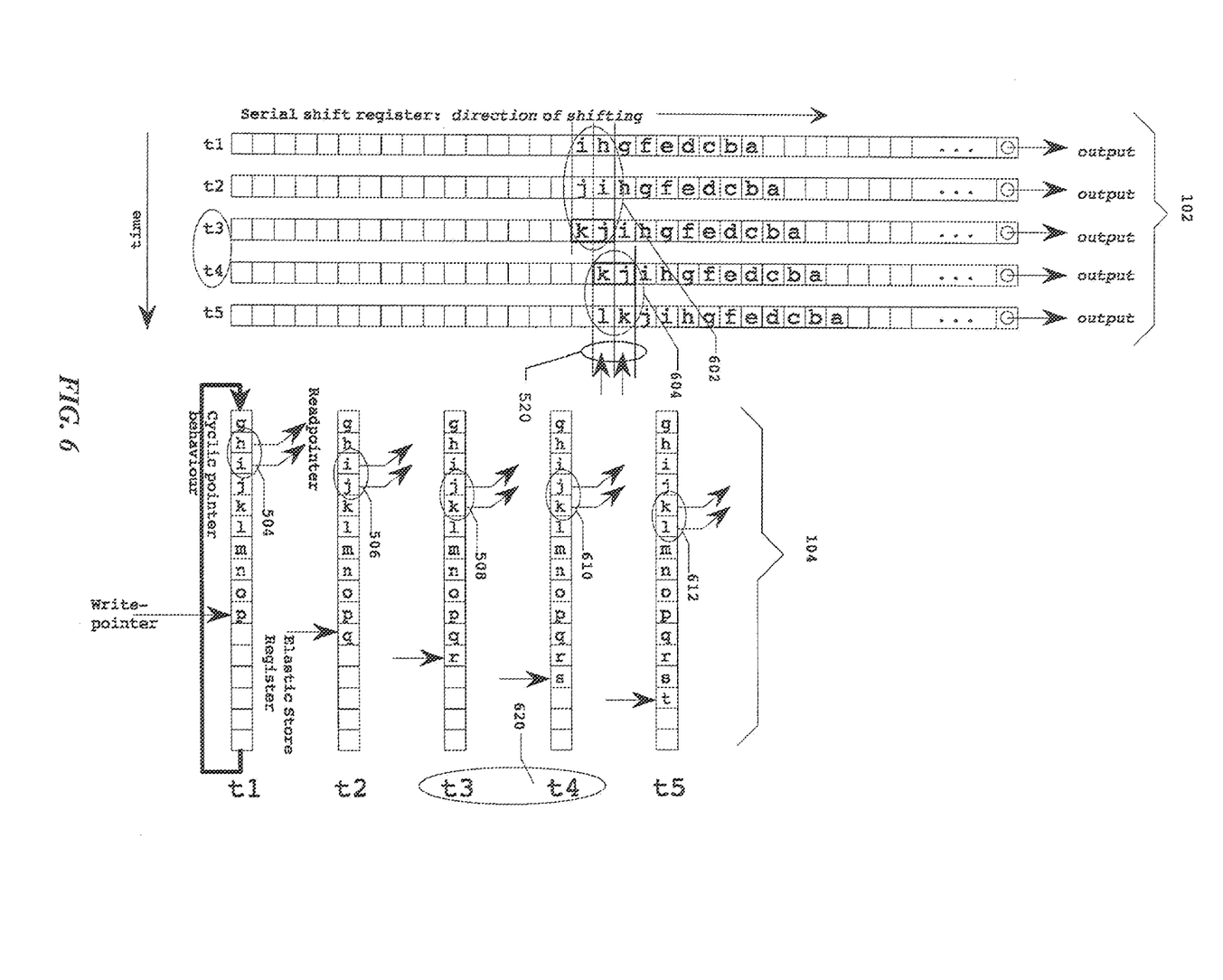
FIG. 6 is a diagram illustrating operation of the apparatus for adjustment of a digital delay function when the delay is reduced in accordance with one embodiment of the present invention.

If the read counter 110 is not changed at one cycle of the read clock the input position 520 in the data memory unit 102 is moved forward by one data element and in consequence the delay is readjusted to its old value. This is illustrated in FIG. 6 and initially data elements 504-508 at times t1-t3 are output (read) from the ESR 104 and subsequently written in the data memory 102 respectively at times t1-t3 in positions 602 with the delay not affected. When the read counter 110 is not changed the input position 520 is increased (i.e. shifted forward) in cycle t4 by one data element. In cycles t4 and t5 data elements 610, 612 are output from ESR 104 and subsequently written in the data memory 102 respectively at times t4-t5 in positions 604. As illustrated in FIG. 6, 620, the data elements read in cycle t4 are the same data elements that were read in cycle t3 (they were read twice). As the difference of the write pointer 108 and the read pointer 110 of the ESR 104 is increased at time position t4, the PLL 114 then will force the pointers to rearrange at 180 degrees in phase. Finally, as a result of this operation, the overall delay is reduced by one element.

Figure 7:
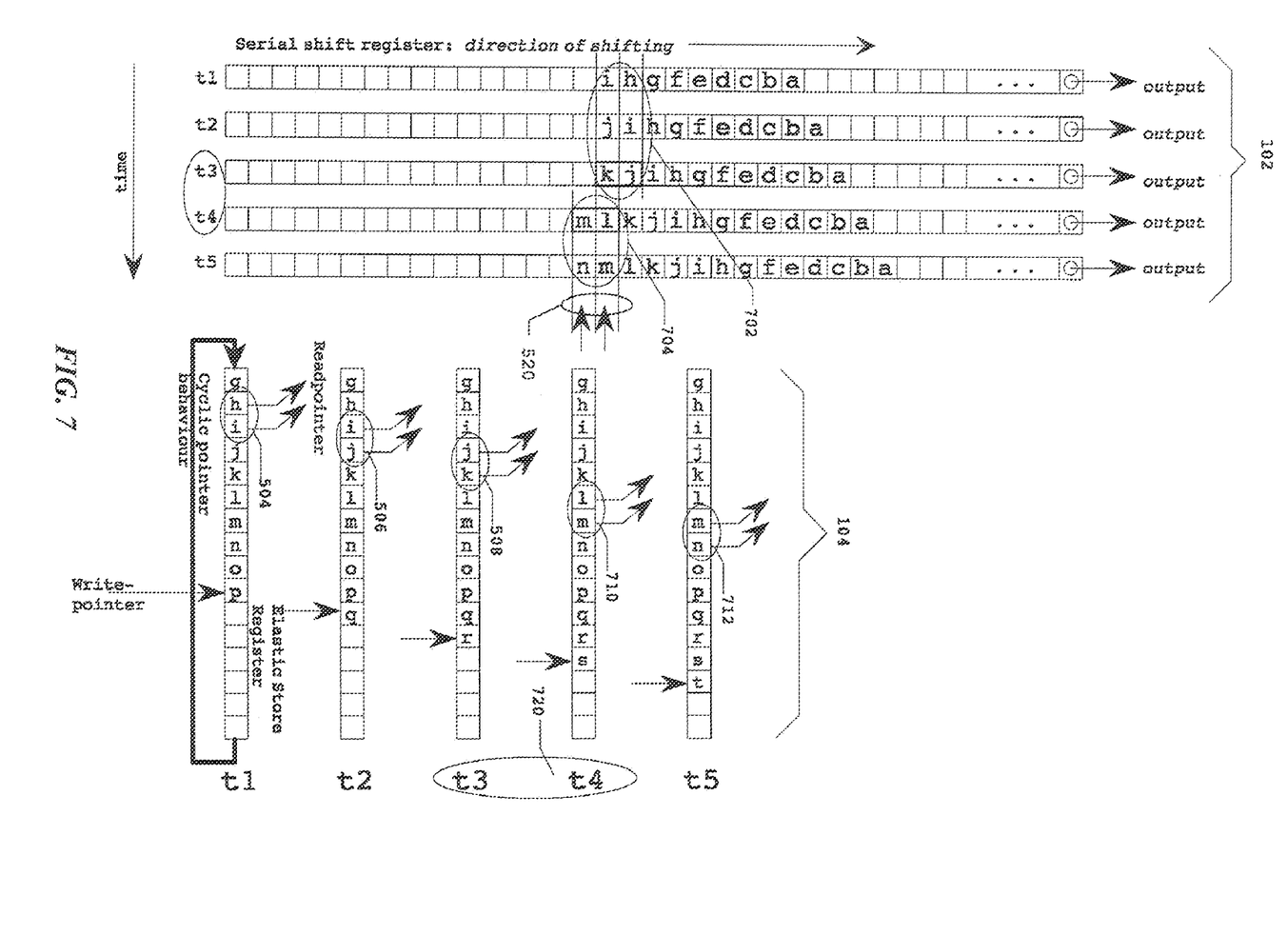
FIG. 7 is a diagram illustrating operation of the apparatus for adjustment of a digital delay function when the delay is increased in accordance with one embodiment of the present invention.

If the read counter 110 is increased by two at one cycle of the read clock the input position 520 in the data memory unit 102 is moved backward by one data element and in consequence the delay is readjusted to its old value. This is illustrated in FIG. 7: initially data elements 504-508 at times t1-t3 are output (read) from the ESR 104 and subsequently written in the data memory 102 respectively at times t1-t3 in positions 702 with the delay not affected. When the read counter 108 is increased by two the input position 520 is decreased (i.e. shifted backward) in cycle t4 by one data element. In cycles t4 and t5 data elements 710, 712 are output (read) from ESR 104 and subsequently written in the data memory 102 respectively at times t4-t5 in positions 704. As illustrated in FIG. 7, 720, the data elements 710 read in cycle t4 are shifted by two stages of the ESR 104 in comparison to data elements 508 read in cycle t3. As the difference of the write pointer 108 and the read pointer 110 of the ESR 104 is reduced at time position t4, the PLL 114 then will force the pointers to rearrange at 180 degrees in phase. Finally, as a result of this operation, the overall delay is increased by one element.

In one embodiment, as illustrated in FIG. 1B the read clock function is controlled by a Phase Detector 106 and a Voltage Controlled Oscillator 112. In general "read" is referred to an "output" whereas "write" is referred to an "input" and considering any apparatus for data transmission, a succeeding circuit usually doesn't have any possibilities to control the clock of the preceding blocks. Therefore the read clock is controlled. In one embodiment the Voltage Controlled Oscillator 112 is part of the apparatus 800 and in alternative embodiment the VCO signals are taken from an external device (i.e. the VCO is not part of the apparatus 800).

In one embodiment the elastic store register 104 is controlled by a Phase Locked Loop (PLL), 114. A phase-locked loop is a closed-loop feedback control system that maintains a generated signal in a fixed phase relationship to an incoming signal. In the embodiment illustrated in FIG. 1B the PLL, 114, consists of a Phase Detector 106, that provides the phase difference to control, a reference signal (not illustrated) that provides a value to compare (i.e. usually 8 when the ESR is 16 elements large), a VCO 112, as well as write and read counters 108 and 110 respectively.

Design and operation of PLL is well known in the art and therefore it is within contemplation of the present invention that the PLL, 114, used in the described above embodiment may be replaced by other types of phase-locked loop circuits without necessity of extensive research or experimentation.

In one embodiment of the present invention the data memory unit 102 has an internal structure of a RAM structure type and in alternative embodiment said data memory unit 102 has an internal structure of a Serial Shift Register.

In different alternative embodiments the apparatus as illustrated in FIG. 1A or FIG. 1B also contains a control logic 115 unit. The control logic 115 is operably connected to the memory 102 and to the write counter 108 or the read counter 110 respectively. It also is connected to an external device such as a microprocessor unit, switches or keys (not illustrated). The control logic 115 operates as an interface if the said external device requests an adjusting of delay. Its function is to synchronise the variable access of the memory 102 with the operations affecting the write counter 108 or the read counter 110 respectively. The change of counters is triggered by the control logic 115, as shown in FIG. 1A or FIG. 1B. The function to halt a counter for one clock cycle could be achieved by deactivating a counter input named "CET" or "enable-T", that is provided with many available counters, such as the type "74AC161" (CMOS 4 bit synchronous presettable binary counter). The function to increase a counter by two could be achieved by activating a counter input named "CEP" or "parallel-enable", that also is provided with many counters, inputting the sum of the actual counter's output plus a constant binary "2".

The invention claimed is:

1. An apparatus for adjusting a digital delay function of a data memory unit, the apparatus comprising:
a data memory unit having a plurality of memory cells to store corresponding data elements;
an elastic store register;
a read clock function and a write clock function configured to control read and write operations;
a read counter associated with the read clock function, and a write counter associated with the write clock function;
wherein the data memory unit is configured to:
operate in series with the elastic store register such that data elements passing through the apparatus are arranged in a parallel structure, and pass through the data memory unit before passing through the elastic storage register;
selectively change an output position from a first memory cell to a second memory cell; and
deliver two subsequent data elements to the elastic store register from two logically neighboring memory cells; and
wherein the elastic store register is configured to write the two subsequent data elements output from the data memory unit at every cycle of the write clock, such that:
if the write counter is increased by one at a cycle of the write clock, the output position in the data memory unit is unchanged;
if the write counter is increased by two at a cycle of the write clock, the output position in the data memory unit is moved backward by one data element; and
if the write counter is unchanged at a cycle of the write clock, the output position in the data memory unit is moved forward by one data element.

2. The apparatus of claim 1 further comprising a Phase Detector and a Voltage Controlled Oscillator configured to control the read clock function.

3. The apparatus of claim 2 wherein the Voltage Controlled Oscillator is configured to receive signals from an external device.

4. The apparatus of claim 2 wherein the Phase Locked Loop controls the elastic store register.

5. The apparatus of claim 2 wherein the data memory unit has a Random Access Memory (RAM) internal structure.

6. The apparatus of claim 2 wherein the data memory unit has a Serial Shift Register internal structure.

7. An apparatus for adjusting a digital delay function of a data memory unit, the apparatus comprising:
a data memory unit having a plurality of memory cells to store corresponding data elements;
an elastic store register;
a read clock function and a write clock function configured to control read and write operations;
a read counter associated with said read clock and a write counter associated with said write clock; and
wherein the data memory unit is configured to operate in series with the elastic store register such that data elements passing through the apparatus are arranged in a parallel structure, and pass through the elastic store register before passing through the data memory unit;
wherein the elastic store register is configured to read, at every cycle of the read clock, two subsequent data elements to be input into the data memory unit; and
wherein the data memory unit is further configured to:
selectively change an input position from a first memory cell to a second memory cell; and
write the two subsequent data elements into two logically neighboring memory cells such that:
if the read counter is increased by one at a cycle of the read clock, the input position in the data memory unit is unchanged;
if the read counter is increased by two at one cycle of the read clock, the input position in the data memory unit is moved backward by one data element; and
if the read counter is not changed at one cycle of the read clock, the input position in the data memory unit is moved forward by one data element.

8. The apparatus of claim 7 further comprising a Phase Detector and a Voltage Controlled Oscillator that controls the read clock function.

9. The apparatus of claim 8 wherein the Voltage Controlled Oscillator is configured to receive signals from an external device.

10. The apparatus of claim 8 wherein a Phase Locked Loop controls the elastic store register.

11. The apparatus of claim 7 wherein the data memory unit has a Random Access Memory (RAM) internal structure.

12. The apparatus of claim 7 wherein the data memory unit has a Serial Shift Register internal structure.

13. A method of adjusting a digital delay function of a data memory unit operating in series with an elastic store register, the method comprising:
    arranging data elements in a parallel structure, the data elements passing through the data memory unit before passing through the elastic store register;
    outputting two subsequent data elements from two logically neighboring memory cells of the data memory unit;
    writing the two subsequent data elements at every cycle of a write clock function in the elastic store register, such that:
        if the write counter is increased by one at a cycle of the write clock, the output position in the data memory unit is unchanged;
        if the write counter is increased by two at one cycle of the write clock, the output position in the data memory unit is moved backward by one data element; and
        if the write counter is not changed at one cycle of the write clock, the output position in the data memory unit is moved forward by one data element.

14. The method of claim 13 further comprising controlling a read clock function using a Phase Detector and a Voltage Controlled Oscillator.

15. The method of claim 14 further comprising receiving signals at the Voltage Controlled Oscillator from an external device.

16. The method of claim 14 further comprising controlling the elastic store register with the Phase Locked Loop.

17. A method of adjusting a digital delay function of a data memory unit operating in series with an elastic store register, the method comprises:
    arranging data elements in a parallel structure, the data elements passing through the elastic store register before passing through the data memory unit;
    reading two subsequent data elements at every cycle of a read clock function in the elastic store register; and
    inputting the two subsequent data elements into two logically neighboring memory cells of the data memory unit such that:
        if the read counter is increased by one at a cycle of the read clock, the output position in the data memory unit is unchanged;
        if the read counter is increased by two at one cycle of the read clock, the output position in the data memory unit is moved backward by one data element; and
        if the read counter is not changed at one cycle of the read clock, the output position in the data memory unit is moved forward by one data element.

18. The method of claim 17 further comprising controlling the read clock function using a Phase Detector and a Voltage Controlled Oscillator.

19. The method of claim 18 further comprising receiving signals at the Voltage Controlled Oscillator from an external device.

20. The method of claim 18 further comprising controlling the elastic store register with the Phase Locked Loop.

* * * * *